United States Patent [19]
Kim

[11] Patent Number: 6,127,954
[45] Date of Patent: Oct. 3, 2000

[54] PRML CODE ENCODING AND DECODING METHODS FOR HIGH-DENSITY DATA STORAGE DEVICE

[75] Inventor: Jin-sook Kim, Yongin, Rep. of Korea

[73] Assignee: Samsung Electronics Co., Ltd., Kyungki-ku, Rep. of Korea

[21] Appl. No.: 09/081,824

[22] Filed: May 20, 1998

[30] Foreign Application Priority Data

Aug. 27, 1997 [KR] Rep. of Korea ............... 97-41341

[51] Int. Cl.[7] ............................................. H03M 7/00
[52] U.S. Cl. ................................. 341/95; 341/59; 341/81
[58] Field of Search ............................. 341/95, 59, 50, 341/102, 62, 81

[56] References Cited

U.S. PATENT DOCUMENTS 4,707,681  11/1987  Eggenberger et al. .............. 340/347
4,786,890  11/1988  Marcus et al. ....................... 341/81
5,260,703  11/1993  Nguyen et al. ..................... 341/100

OTHER PUBLICATIONS

IBM Technical Disclosure Bulletin, vol. 32, No. 5B, Oct. 1989, pp. 1–3, XP002104797.
P. Horowitz and W. Hill, "The Art of Electronics", Cambridge University Press, 1980, p. 333, XP002104798.
P.H. Siegel and J.K. Wolf, Modulation and Coding for Information Storage, IEEE Communications Magazine, vol. 29, No. 12, Dec. 1991, pp. 68–86, XP000287983.

*Primary Examiner*—Michael Tokar
*Assistant Examiner*—Jean B. Jeanglaude
*Attorney, Agent, or Firm*—Kile, McIntyre, Harbin & Lee; Eugene M. Lee

[57] ABSTRACT

An encoding and decoding method compressing and error-correction encoding an input 8-bit data to immunize the input data to noise and other signal distortion causing factors. The error-corrected data is encoded to 9-bit codewords modulated to be suitable for the channel characteristics of the storing device. A signal is generated for the input 8-bit data encoded to modulation codes, then pre-compensated and recorded. The generated signal is processed to be easily detected by reproducing the 9-bit codewords. The processed signal is detected to minimize an error rate. The detected signal is decoded according to channel characteristics, and recovered to the input 8-bit user data through error correction and compression decoding.

8 Claims, 2 Drawing Sheets

PRML CODE ENCODING AND DECODING METHODS FOR HIGH-DENSITY DATA STORAGE DEVICE

BACKGROUND OF THE INVENTION

1. Field of the Invention

The present invention relates to partial response maximum likelihood (PRML) code encoding and decoding methods for a high-density data storage device. More particularly, it relates to PRML code encoding and decoding methods for a high-density data storage device, in which digital data is magnetically recorded on and reproduced from a disk memory device with high density without interference between signals.

2. Description of the Related Art

Research has been conducted to more efficiently utilize mass quantities of information in a rapidly developing information society, resulting in great progress in many fields.

In a storing device field, the focus of research has been to transmit large amounts of information, and to reduce the time required to process information, thereby to satisfy information needs in the information-competitive society. That is, efforts are being made to develop rapid transmission of reliable information, while increasing the amount of data recorded (recording density) in a given storage device.

For high-speed, large capacity data storage devices, material aspects are considered in connection with improving the physical characteristics or increasing the accuracy of a storage medium.

Further, signal processing aspects are considered in connection with increasing the recording density of the storage device and facilitating detection of a reproduced signal through efficient encoding and decoding, or reducing data detection errors, relying on signal processing technology.

Studies have been made to increase the amount (recording density) of data recorded on a given storage device during recording and reproducing of data and to rapidly transmit reliable information.

A storing device having data recorded with a high density enables efficient encoding, which in turn reduces redundancy and facilitates signal detection.

However, the problem of intersymbol interference (ISI) becomes more prominent with higher-density recording.

In general, data recorded on a storage device is encoded to run length limited (RLL) codes. The RLL code limits succession of recorded data symbols for timing control of data sampling clock signals and signal detection. That is, in the RLL code, the number of zeros between ones is limited to a minimum of d for easy signal detection and to a maximum of k for timing of data during playback of a signal.

Recently used RLL code encoding methods include code rate 1/2 RLL(2, 7), 2/3 RLL(1, 7), 8/9 RLL(0, 3), and 8/9 RLL(0, 4/4) encoding methods.

The first two encoding methods have d's of 1 and 2, respectively. Thus, they allow one zero and two zeros between ones, respectively, thereby reducing interference between signals.

Despite the advantage of the decrease in signal interference, these methods require many bits to transmit given user data due to a large redundancy caused by their low code rates.

Hence, a low-code rate encoding method causes more intersymbol interferences than a high-code rate encoding method such as the 8/9 RLL(0, 3) and 8/9 RLL(0, 4/4) methods, thus nullifying the advantage of allowance of at least one zero between transitions. The high-code rate encoding method is more favorable for recording and reproducing data due to a smaller redundancy than the low-code rate encoding method.

The high-code rate encoding method increases a channel input SNR, reduces interference between data due to a small redundancy, and enables high-density recording.

In general, a channel should be modeled after an actual one in recording and reproducing data in a storing device. To reflect the channel characteristic of the storing device, channel characteristics can be expressed as $(1+D^n)$ (n=1, 2, ... ) or $(1-D)(1+D)^n$ (n=1, 2, ... ), where D is delay. Thus, $(1+D^n)$ represents the original data plus n-time delayed data.

In the PRML method, mutually controlled intersymbol interference is set between current data and previous data by precoding an input signal and then data is detected in a Viterbi decoder by modifying a target response $d_k$ to $a_k + a_{k-1}$ or $a_k - a_{k-2}$, where a is input data, and k is an index.

The PRML method shows excellent detection performance with a recording density of the signal interference given under a channel characteristic of (n=1).

As data is recorded at a higher density, the distance between transitions becomes smaller, thus worsening the intersymbol interference between data. To reduce the interference in high-density recording, the distance between transitions should be increased.

An RLL(1, 7) encoding method, employing this concept, encodes data to have at least one zero between symbols.

However, though the RLL(1, 7) encoding method limits transitions, it has a low code rate.

Therefore, to transmit given data, more bits than the high-code rate encoding methods 8/9 RLL(0, 3) and 8/9 RLL(0, 4/4) are required leading to a small distance between recorded data. As a result, interference between data becomes serious.

That is, a high-code rate encoding method is more useful in recording and reproducing data in channels of a storage device than a low-code rate encoding method.

In addition, the high-code rate encoding method reduces interference between data and non-linearity, relative to the low-code rate encoding method, thus enabling high-density recording.

To reduce the intersymbol interference, there are two schemes: increasing code rate; and setting the interval between transitions.

However, both have a trade-off relationship. That is, it is impossible to set some interval between transitions without reducing the code rate, and the code rate cannot be increased with the interval being kept between transitions.

The 2/3 RLL(1, 7) encoding method relies on the latter method. On the other hand, the 8/9 RLL(0, 3) and 8/9 RLL(0, 4/4) encoding methods are suggested from a different viewpoint. These encoding methods have higher channel SNRs due to their high code rates than low-code rate encoding methods. Further, fewer bits are used than in the low-code rate decoding methods to record given data. Thus, intersymbol interference and thus non-linearity can be reduced.

However, intersymbol interference becomes a serious problem as the recording density of a data storing device is increased.

SUMMARY OF THE INVENTION

To solve the above problem, it is an object of the present invention to provide PRML code encoding and decoding methods for a high-density data storage device, which has optimized input and output lookup tables and a simplified codeword generating equation for encoding and decoding a block code with a code rate of 8/9 and a maximum transition run of 3.

To achieve the above object, there are provided encoding and decoding methods for a high-density data storage device. In the encoding and decoding methods, input 8-bit data is compressed and error-correction encoded to be immunized to noise and other signal-distortion causing factors. The error-corrected data is encoded to 9-bit codewords modulated to be suitable for the channel characteristics of the storing device. A signal is generated for the input 8-bit data encoded to modulation codes. The generated signal is pre-compensated and recorded. The generated signal is processed to be easily detected by reproducing the 9-bit codewords. The processed signal is detected to minimize an error rate. The detected signal is decoded according to channel characteristics, and recovered to the input 8-bit user data through error correction and compression decoding.

BRIEF DESCRIPTION OF THE DRAWINGS

The above objects and advantages of the present invention will become more apparent by describing in detail preferred embodiments thereof with reference to the attached drawings, in which.

DETAILED DESCRIPTION OF THE PREFERRED EMBODIMENTS

Figure 1:
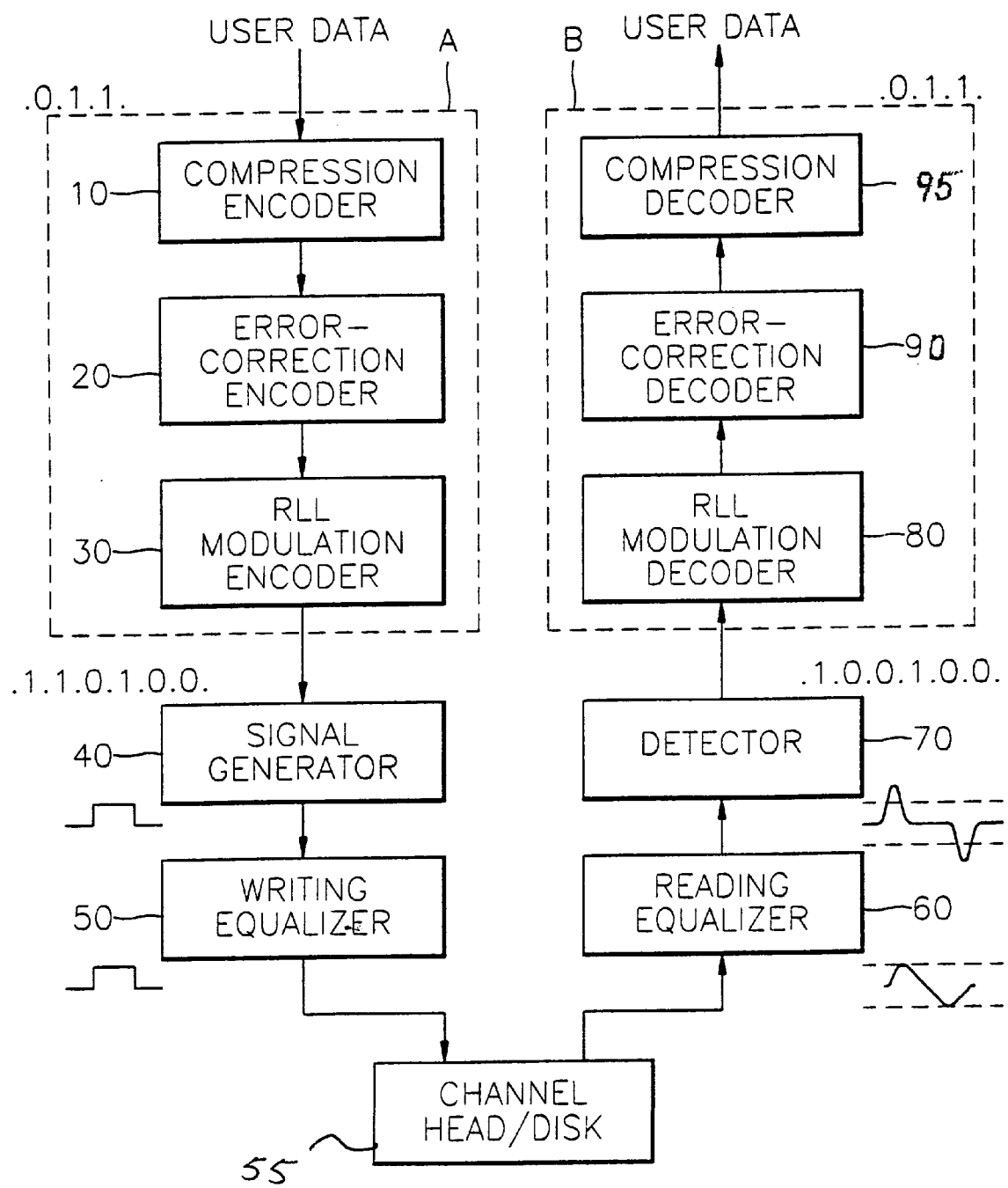
FIG. 1 is a block diagram of a high-density data storage device for encoding and decoding PRML codes according to the present invention.

FIG. 1 is a block diagram of a high-density data storage device for PRML code encoding and decoding as a general process to which the present invention is applied.

As shown, the storage device includes a compression encoder 10 for compressing user data, an error-correction encoder 20 for performing an error-correction on the compressed data, an RLL modulation encoder 30 for encoding the error-corrected data to RLL modulation codes, a signal generator 40, a writing equalizer 50, a channel head/disk 55, a reading equalizer 60, a detector 70 for detecting a signal, an RLL modulation decoder 80 for decoding data to RLL modulation codes, an error-correction decoder 90 for performing an error-correction decoding, and a compression decoder 95.

The general process, to which the present invention is applied in the high-density data storage device, will be described.

In order to record and reproduce data with high density without interference between signals, a data encoder A, a data decoder B, reading equalizer 60, writing equalizer 50, and a detector 70 are used. User data is compressed, error-corrected, and encoded to modulation codes suitable for a channel.

After the encoded signal is recorded and reproduced, a signal is detected in the detector through the equalizer, and decoded, to thereby recover the user data.

The operational principle of the present invention will be described as follows.

Referring to FIG. 1, a signal to be recorded in a storage device is compressed in the compression encoder 10 to protect previous data and encoded in the error-correction encoder 20, thus being protected from noise and other signal-distortion causing factors. More specifically, 8-bit data is input into compression encoder 10 where it is compressed by any suitable method. The compressed 8-bit data is error-correction encoded by any suitable method.

Then, the error-corrected signal is encoded to modulation codes suitable for channel characteristics of the storing device, in the RLL modulation encoder 30. More specifically, the 8-bit compressed and error-corrected data is encoded to 9-bit codewords. The 8-bit input data, which are in a predetermined series of 8-bit binary data symbols with an integer time of k as an index, $X_K$ of 1 or 0, and k of 1, 2, ..., 8 in a storing device or a communications channel, is received and encoded to predetermined 9-bit codewords with $Y_K$ of 1 or 0 and k of 1, 2, ..., 9 in the following substeps:

(1) generate a 9-bit codeword with a maximum transition run (MTR) of 3 according to any suitable known method, (2) generate a 9-bit codeword with a maximum zero run length k of 7 with respect to the 9-bit codeword generated in (1) according to any suitable known method, (3) determine whether the fifth bit of the 9-bit codeword satisfying (1) and (2) is zero, going to step (4) if the determination result is zero, and jumping to (5) if the determination result is not zero, (4) map the first four bits and last four bits of the input 8-bit user data to the first four bits and last four bits of the 9-bit codeword without variation; i.e., those bits have the same bit pattern, (5) map the input 8-bit user data excluded in substep (4) to the most approximate 9-bit codewords which have ones in the fifth bits thereof; i.e., the user data is mapped in a range in which the bit patterns possibly maintain similarity, and (6) make encoder and decoder mapping between the input 8-bit user data and the 9-bit codewords according to the mapping results of substeps (4) and (5) and simplify the mapping to Karnaugh maps.

Figure 2:
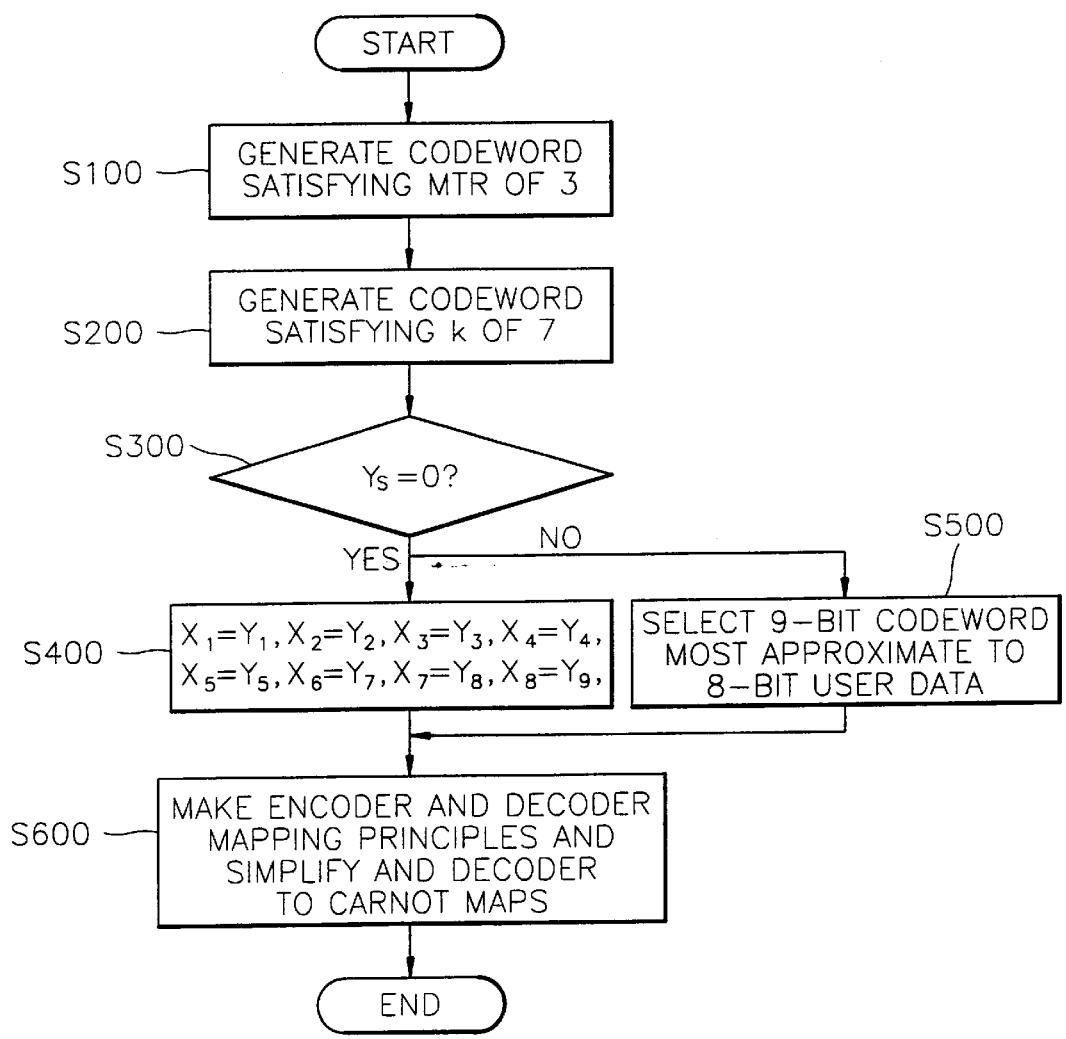
FIG. 2 is a flowchart illustrating a method for generating PRML codes with a code rate of 8/9, a maximum transition run (MTR) of 3, and k of 7.

FIG. 2 explains the modulation encoder/decoder in greater detail.

A signal is generated in the signal generator 40, and pre-compensated in the writing equalizer 50. Then, the pre-compensated signal is recorded and reproduced at the channel head/disk 55. The reproduced signal is processed in the reading equalizer 60 to facilitate signal detection, and a signal is detected in the detector 70 to minimize the error rate. The data is recovered by performing in reverse the data recording process in the storage device.

A maximum transition run (MTR) method is suggested to record data in a data storage device with high density. This encoding method allows an MTR of 2 similar to the 2/3 RLL(1, 7) encoding method for recording data with at least one sample between transitions, and increases a code rate influencing the channel input SNR. Thus, the MTR encoding method is suitable for high-density recording for a data storing device.

The present invention pertains to encoding modulation codes suitable for a partial response channel for maximum likelihood (ML) detection expressed as $(1-D)(1+D)^n$ (n=1, 2, ...), and limits MTR to 3.

Thus, an MTR of 3 is allowed and, on the other hand, the code rate influencing a channel input SNR is increase relative to a conventional MTR encoding method, so that data is efficiently recorded and reproduced.

An encoding method with a code-rate of 8/9 and an MTR of 3 shows a high code rate, and reduces viterbi detector paths like a 2/3 RLL(1, 7) with a MTR of 2 encoding method, thus decreasing the delay and complexity of a detector.

In addition, in the present invention, the constraint k is 7 for timing and gain control to thereby keep the self-clocking characteristics of a signal and facilitate signal detection.

The code-rate of 8/9 and an MTR of 3 encoding method is suitable for a high-density data storage device since it is byte-oriented and has minimal redundancy.

The present invention deals with modulation codes suitable for a partial response channel of ML detection. These modulation codes offer frequent non-zero samples and thus improves the timing of the partial response channel and the performance of a gain control circuit. Further, they limit the complexity of a ML detector by reducing paths during a process in a data estimator.

A modulation codes has two parameters in the present invention: MTR and k. MTR represents a maximum transition run in a channel output code bit sequence and reduces intersymbol interference, whereas k represents a maximum zero run length in a coded sequence, and is used for accuracy of timing and gain control, and self-clocking. In the present invention, the MTR is 3, and k is 7.

The code constraints for encoding and decoding data are applicable to a partial response signal transmission system for ML detection. In the present invention, the constraints are a code rate of 8/9, an MTR of 3, and k of 7, and optimized lookup tables for encoding and decoding block codes under such code constraints are provided.

FIG. 2 is a flowchart illustrating a method for generating a PRML code under a code rate of 8/9, an MTR of 3, and k of 7.

A block code with a code rate of 8/9, and MTR of 3, and k of 7 provides 257 9-bit codewords which correspond to 8-bit data bytes. Thus, every 8-bit data combination can be encoded to and decoded from a corresponding 9-bit codeword.

In the present invention, read backward symmetry is kept by introducing a particular method for converting an 8-bit data to a 9-bit codeword, and the 9-bit codeword has a similar structure to that of the 8-bit binary data through byte partitioning. Byte partitioning facilitates one-to-one correspondence of the 8-bit binary data to the 9-bit codeword so that the complexity of an encoder and a decoder is kept to a minimum.

Assuming that Y is a 9-bit codeword with a code rate of 8/9, an MTR of 3, and k of 7, Y can be expressed as $$Y=\{Y1, Y2, Y3, Y4, Y5, Y6, Y7, Y8, Y9\} \quad (1)$$

In the PRML encoding and decoding methods for a high-density data storing device, the 9-bit codeword encoding step is for receiving the 8-bit input data, which are a predetermined series of 8-bit binary data symbols with an integer time of k as an index, $X_K$ of 1 or 0, and k of 1, 2, ..., 8 in a storage device or a communications channel, and encoding the 8-bit input data to predetermined 9-bit codewords with $Y_K$ of 1 or 0 and k of 1, 2, ..., 9. The 9-bit codeword encoding step includes the substeps of (step 100–step 600).

In step 100, a codeword with a maximum transition run (MTR) of 3 is generated. A 9-bit codeword with a code rate of 8/9 and an MTR of 3 is generated from a 9-bit sequence having a successive transition run of 2 or above at its left end, a successive transition run of 3 or above at its right end, or a successive transition run of 4 or above, from the total encoded sequences.

The constraint (MTR=3) is given as a Boolean equation as follows:

$$\overline{(Y_1Y_2)} \; \overline{(Y_1Y_2Y_3Y_4)} \; \overline{(Y_2Y_3Y_4Y_5)}$$

$$\overline{(Y_3Y_4Y_5Y_6)} \; \overline{(Y_4Y_5Y_6Y_7)} \; \overline{(Y_5Y_6Y_7Y_8)}$$

$$\overline{(Y_6Y_7Y_8Y_9)} \; \overline{(Y_7Y_8Y_9)}=1 \quad (2)$$

In step 200, a codeword with a maximum zero run length k of 7 is generated with respect to the codeword generated in step 100. To generate 9-bit codeword with k of 7, a codeword is removed from the whole sequence, which as a zero run length of 5 from its left end, a zero run length of 4 from its right end, or a zero run length of 7. The constraint (k=3) is expressed as $$\overline{(Y1+Y2+Y3+Y4+Y5)} \; \overline{(Y6+Y7+Y8+Y9)}=1 \quad (3)$$

There are 293 9-bit binary codewords satisfying equation (2), and there are 257 9-bit codewords satisfying equations (2) and (3).

Therefore, the efficiency is very high since only one extra codeword exists. This extra codeword can be used to remove an unintended codeword pattern or detect errors.

In step 300, it is determined whether the middle bit of the 9-bit codeword satisfying equations (2) and (3) is zero, and a method for mapping the input 8-bit data to 9-bit bit codewords is varied. Specifically, it is determined whether the fifth bit of the 9-bit codeword satisfying step 100 and step 200 is zero, and the procedure goes to step 400 if the determination result is zero, and jumps to step 500 if the determination result is not zero.

In step 400, which is a step performed when the middle bits of the 9-bit codewords are zeroes, partitioning is used to give regularity between the 9-bit codewords and the input 8-bit user data sequence.

The first four bits and last four bits of the 8-bit data are mapped to the first four bits and last four bits of the 9-bit codeword without variations. In this partitioning, the middle bit, that is, the fifth bit of a 9-bit codeword is always zero.

That is, the first four bits and last four bits of the 9-bit codeword having a middle bit as zero among the 9-bit codeword satisfying equations (2) and (3) are mapped from the 8-bit binary data having the same first four bits and last four bits. There are 143 pairs of 8-bit data bits and 9-bit codewords separated by partition using the symmetry between the 8-bit user data and the 9-bit encoded data.

In step 500, the other 8-bit sequences (excluded in step 400) are mapped to 9-bit codewords.

That is, when the input 8-bit user data excluded in step 400 is mapped to 9-bit codewords, the 9-bit codewords are most approximate to the 8-bit user data among 28–143 9-bit codewords having the middle bits as zeroes, in order to reduce the complexity of an encoder and a decoder. The input 8-bit user data excluded in step 400 is mapped to the most approximate 9-bit codewords which have ones in the fifth bits thereof. In step 600, encoder and decoder mapping principles between the input 8-bit user data and the 9-bit codewords are applied according to the mapping results of step 400 and step 500, and simplified to Karnaugh maps.

In the input 8-bit data decoding step, the 9-bit codewords are decoded to the 8-bit binary data symbols by generating predetermined 8-bit binary data sequences with $X_K$ of 1 or 0, and k of 1, 2, ..., 8 from the 9-bit codewords with $Y_K$ of 1 or 0 and k of 1, 2, ..., 9. This step is performed by performing in reverse the step of encoding the 8-bit user data to the 9-bit codewords.

Table 1 shows 9-bit codewords (PRML codes) with a code rate of 8/9, an MTR of 3, and k of 7, mapped to 8-bit user data in accordance with FIG. 2, expressed in hexadecimal format.

TABLE 1

FF→ 056 DB→ 072 B7→ 0DA 93→ 123 6F→ 11D 4B→ 088 27→ 059 03→ 03B
FE→ 0D4 DA→ 052 B6→ 156 92→ 122 6E→ 0CE 4A→ 08A 26→ 046 02→ 036
FD→ 0B4 D→ 032 B5→ 165 91→ 121 6D→ 0CD 4→ 089 25→ 045 01→ 035
FC→ 094 D8→ 012 B4→ 164 90→ 098 6C→ 0CC 48→ 088 24→ 044 00→ 138
FB→ 074 D7→ 0DC B3→ 163 8F→ 0D6 6B→ 0CB 47→ 058 23→ 043
FA→ 054 D6→ 136 B2→ 162 8E→ 10E 6A→ 0CA 46→ 086 22→ 042
F9→ 034 D5→ 135 B1→ 161 8D→ 10D 69→ 0C9 45→ 085 21→ 041
F8→ 014 D4→ 134 B0→ 09A 8C→ 10C 68→ 0C8 44→ 084 20→ 019
F7→ 055 D3→ 133 AF→ 159 8B→ 10B 67→ 05D 43→ 083 1F→ 118
F6→ 176 D2→ 132 AE→ 14E 8A→ 10A 66→ 0C6 42→ 082 1E→ 02E
F5→ 175 D1→ 131 AD→ 14D 89→ 109 65→ 0C5 41→ 081 1D→ 02D
F4→ 174 D0→ 09C AC→ 14C 88→108 64→ 064 40→ 010 1C→ 02C
F3→ 173 CF→ 158 AB→ 14B 87→ 095 63→ 0C3 3F→ 11A 1B→ 02B
F2→ 172 CE→ 0D1 AA→ 14A 86→ 106 62→ 0C2 3E→ 06E 1A→ 02A
F1→ 171 CD→ 081 A9→ 149 85→ 105 61→ 0C1 3D→ 06D 19→ 029
F0→ 015 CC→ 091 A8→ 148 84→ 104 60→ 01D 3C→ 06C 18→ 028
EF→ 15D CB→ 071 A7→ 0D9 83→ 103 5F→ 11C 3B→ 06B 17→ 058
EE→ 0D3 CA→ 051 A6→ 146 82→ 102 5E→ 0AE 3A→ 06A 16→ 026
ED→ 0B3 C9→ 031 A5→ 145 81→ 101 5D→ 0AD 39→ 069 15→ 025
EC→ 093 C8→ 011 A4→ 144 80→ 076 5C→ 0AC 38→ 068 14→ 024
EB→ 073 C7→ 0DB A3→ 143 7F→ 0D6 5B→ 0AB 37→ 05A 13→ 023
EA→ 053 C6→ 116 A2→ 142 7E→ 0EE 5A→ 0AA 36→ 066 12→ 022
E9→ 033 C5→ 115 A1→ 141 7D→ 0ED 59→ 0A9 35→ 065 11→ 021
E8→ 013 C4→ 114 A0→ 099 7C→ 0EC 58→ 0AB 34→ 064 10→ 018
E7→ 0DD C3→ 113 9F→ 158 7B→ 0EB 57→ 05C 33→ 063 0F→ 13B
E6→ 156 C2→ 112 9E→ 12E 7A→ 0EA 56→ 0A6 32→ 062 0E→ 0BA
E5→ 155 C1→ 111 9D→ 12D 79→ 0E9 55→ 0A5 31→ 061 0D→ 0B9
E4→ 154 C0→ 09B 9C→ 12C 78→ 0EB 54→ 0A4 30→ 01A 0C→ 0B8
E3→ 153 BF→ 15A 9B→ 12B 77→ 095 53→ 0A3 2F→ 119 0B→ 0BB
E2→ 152 BE→ 16E 9A→ 12A 76→ 0E6 52→ 0A2 2E→ 04E 0A→ 03A
E1→ 151 BD→ 16D 99→ 129 75→ 0E5 51→ 0A1 2D→ 040 09→ 039
E0→ 09D BC→ 16C 98→ 128 74→ 0E4 50→ 01C 2C→ 04C 08→ 13A
DF→ 15C BB→ 16B 97→ 0DB 73→ 0E3 4F→ 11B 2B→ 04B 07→ 139
DE→ 0D2 BA→ 16A 96→ 126 72→ 0E2 4E→ 08E 2A→ 04A 06→ 086
DD→ 082 B9→ 169 95→ 125 71→ 0E1 4D→ 08D 29→ 049 05→ 0B5
DC→ 092 B8→ 168 94→ 124 70→ 075 4C→ 08C 28→ 048 04→ 038

Table 2A illustrates the encoding mapping principle to map from the 8-bit user data to the 9-bit codewords with a code rate of 8/9, an MTR of 3, and k of 7, in order to simplify an encoder circuit for step 600.

TABLE 2A $G = (A_7A_6' + A_7'(A_6 + A_5 + A_4))(A_3 + A_2 + A_1 + A_0)(A_2' + A_1' + A_0')$
$H = A_7A_6A_7'(A_2 + A_1 + A_0)(A_2' + A_1' + A_0')$
$J = A_7A_6A_3'(A_2' + A_1' + A_0')$
$K = (A_6 + A_5 + A_4)(A_6' + A_5' + A_4')(A_2A_1A_0 + A_3'A_2'A_1'A_0')$
$L = A_7'A_6'A_5'A_4'A_3'(A_2 + A_1 + A_0)(A_2' + A_1' + A_0')$
$LL = A_7'A_6'A_5'A_4'A_3(A_2 + A_1 + A_0)(A_2' + A_1' + A_0')$
$M = A_7'A_6'A_5'A_4'(A_2A_1A_0 + A_2'A_1'A_0')$
$N = (A_7'A_6A_5A_4 + A_7A_6'A_5'A_4')(A_2A_1A_0 + A_3'A_2'A_1'A_0')$
$O = A_7A_6A_5A_4(A_2A_1A_0 + A_3'A_2'A_1'A_0')$
$C_8 = GA_7 + H + KA_3 + M$
$C_7 = GA_6 + JA_2 + KA_7A_3' + L(A_2A_1 + A_2A_0) + LL(A_2 + A_1A_0) + NA_2$
$C_6 = GA_5 + HA_5 + JA_1 + K((A_3 \oplus A_2) + A_7A_3) + N(A_3A_2 + A_3'A_2') + OA_2$
$C_5 = GA_4 + HA_4 + JA_0 + L + LL + M + NA_2'$
$C_4 = H + J + K + L + LL + M + N + O$
$C_3 = GA_3 + K + L(A_1A_0 + A_1'A_0') + LL + M$
$C_2 = GA_2 + HA_2 + JA_5A_4 + K(A_5A_5 + A_6A_4) + L(A_1 \oplus A_0) + N + O$
$C_1 = GA_1 + HA_1 + J(A_5 \oplus A_4) + K(A_5A_4 + A_5'A_4') + LA_1 + LLA_1 + MA_3 + NA_7 + OA_3$
$C_0 = GA_0 + HA_0 + JA_4' + KA_4' + LA_0 + LLA_0 + MA_2 + NA_6 + OA_3'$ Table 2B illustrates the decoding mapping principle to map to the 8-bit user data from the 9-bit codewords with a code rate of 8/9, an MTR of 3, and k or 7, in order to simplify a decoder circuit for step 600.

TABLE 2B $G = C_4'$
$H = C_8C_7'C_4C_3'$
$J = C_8'C_4C_3'(C_2' + C_1')(C_2' + C_0')$
$K = C_5'C_4C_3(C_8' + C_7')(C_2' + C_1')$
$L = C_8'C_6'C_5C_4(C_7' + C_3')(C_3 + C_2)$
$LL = C_8'C_6'C_5C_4C_3C_2'(C_7 + (C_1 \oplus C_0))$
$M = C_8C_7'C_6'C_5C_4C_3C_2'$
$N = C_8'C_4C_3'C_2(C_7 + C_6)(C_6 + C_5')(C_7 + C_5)(C_1 + C_0)$
$O = C_8'C_7'C_5'C_4C_3C_2(C_6 + C_0)(C_1 + C_0)$
$A_7 = GC_8 + H + J + K(C_7 + C_8C_6) + NC_1 + O$
$A_6 = GC_7 + H + J + K(C_2 + C_1C_0) + NC_0 + O$
$A_5 = GC_6 + HC_6 + J(C_1C_0 + C_1'C_0') + K(C_1 \oplus C_0) + NC_0 + O$
$A_4 = GC_5 + HC_5 + JC_0' + KC_0' + NC_0 + O$
$A_3 = GC_3 + J + KC_8 + LL + MC_1 + NC_7C_6 + OC_1$
$A_2 = GC_2 + HC_2 + JC_7 + K(C_8 + C_6) + L(C_7 + C_2'C_1'C_0') + LL(C_7 \oplus (C_1C_0)) + MC_0 + NC_7 + 0C_6$
$A_1 = GC_1 + HC_1 + JC_6 + K(C_8 + C_6) + LC_1 + LLC_1 + MC_0 + NC_7 + OC_6$
$A_0 = GC_0 + HC_0 + JC_5 + K(C_8 + C_6) + LC_0 + LLC_0 + MC_0 + NC_7 + OC_6$ According to the present invention as constituted above, data is efficiently recorded and reproduced by increasing a code rate which affects a channel input SNR, optimized input and output lookup tables and a simplified codeword generating equation for encoding and decoding a block code with a code rate of 8/9 and an MTR of 3 are provided, and a higher recording density can be enabled than an encoding method having an MTR of 2.

Korean application No 97-41341, filed Aug. 27, 1997 is expressly incorporated by reference.

What is claimed is:

1. A PRML code encoding method for encoding and recording 8-bit data on a high-density data storage device, comprising the steps of:

(a) compressing and error-correction encoding an input 8-bit data to protect the input 8-bit data from noise and other signal-distortion causing factors, and generating a compressed error-corrected 8-bit data;

(b) encoding the compressed error-corrected 8-bit data to a 9-bit codeword modulated to be suitable for channel characteristics of a storage device;

(c) generating a signal from the 9-bit codeword; and (d) pre-compensating the generated signal and recording the pre-compensated signal on the storing device;

wherein in step (b), the 8-bit input data, which are a predetermined series of 8-bit binary data symbols with an integer time of k as an index, $X_K$ of 1 or 0, and k of 1, 2, . . . , 8 in a storing device or a communications channel, is received and encoded to a predetermined 9-bit codeword with $Y_K$ of 1 or 0 and k of 1, 2, . . . , 9, and the step (b) includes the substeps of:

(b1) generating a 9-bit codeword with a maximum transition run (MTR) of 3;

(b2) generating a codeword with a maximum zero run length k of 7 from the codeword generated in (b1);

(b3) determining whether the fifth bit of the 9-bit codeword satisfying (b1) and (b2) is zero, going to step (b4) if the determination result is zero, and jumping to (b5) if the determination result is not zero;

(b4) mapping the first four bits and last four bits of the input 8-bit user data to the first four bits and last four bits of the 9-bit codeword without variation;

(b5) if the determination result of step b3 was not zero, mapping the input 8-bit user data to the most approximate 9-bit codeword which has a one in the fifth bit thereof; and (b6) making encoder and decoder mapping between the input 8-bit user data and the 9-bit codewords according to the mapping results of steps (b4) and (b5) and simplifying the mapping principles to Karnaugh maps.

2. The PRML code encoding method as claimed in claim 1, wherein the constraint (MTR=3) satisfies a Boolean equation:

$$\overline{(Y_1Y_2)}\ \overline{(Y_1Y_2Y_3Y_4)}\ \overline{(Y_2Y_3Y_4Y_5)}\ \overline{(Y_3Y_4Y_5Y_6)}\ \overline{(Y_4Y_5Y_6Y_7)}\ (\overline{Y_5Y_6Y_7Y_8})\ \overline{(Y_6Y_7Y_8Y_9)}\ \overline{(Y_7Y_8Y_9)}=1$$

where Y indicates a 9-bit codeword, and the subscripts indicate the bit orders of the 9-bit codeword.

3. The PRML code encoding method as claimed in claim 1, wherein the step(b2), the constraint k of 7 satisfies the equation:

$$(Y1+Y2+Y3+Y4+Y5)\ (Y6+Y7+Y8+Y9)=1$$

where Y indicates a 9-bit codeword and the subscripts indicate the bit orders of the 9-bit codeword.

4. The PRML code encoding method as claimed in claim 1, wherein the encoder mapping in step(b6) is expressed as:

$G=(A_7A_6'+A_7'(A_6+A_5+A_4))\ (A_3+A_2+A_1+A_0)\ (A_2'+A_1'+A_0')$ $H=A_7A_6A_5'(A_2+A_1+A_0)\ (A_2'+A_1'+A_0')$ $J=A_7A_6A_5'(A_2'+A_1'+A_0')$ $K=(A_6+A_5+A_4)\ (A_6'+A_5'+A_4')\ (A_2A_1A_0+A_3'A_2'A_1'A_0')$ $L=A_7'A_6'A_5'A_4'A_3'(A_2+A_1+A_0)\ (A_2'+A_1'+A_0')$ $LL=A_7'A_6'A_5'A_4'A_3'(A_2+A_1+A_0)\ (A_2'+A_1'+A_0')$ $M=A_7'A_6'A_5'A_4'(A_2A_1A_0+A_2'A_1'A_0')$ $N=(A_7'A_6A_5A_4+A_7A_6'A_5'A_4')\ (A_2A_1A_0+A_3'A_2'A_1'A_0')$ $O=A_7A_6A_5A_4\ (A_2A_1A_0+A_3'A_2'A_1'A_0')$ $C_8=GA_7+H+KA_3+M$ $C_7=GA_5+JA_2+KA_7A_3'+L(A_2A_1+A_2A_0)+LL(A_2+A_1A_0)+NA_2$ $C_6=GA_3+HA_3+JA_1+K(A_3 \oplus A_2)+A_7A_6)+N(A_3A_2+A_3'A_2')+OA_2$ $C_5=GA_4+HA_4+JA_0+L+LL+M+NA_2'$ $C_4=H+J+K+L+LL+M+N+O$ $C_3=GA_3+K+L(A_1A_0+A_1'A_0')+LL+M$ $C_2=GA_2+HA_2+JA_5A_4+K(A_6A_5+A_5A_4)+L(A_1 \oplus A_0)+N+O$ $C_1=GA_1+HA_2+J(A_5 \oplus A_4)+K(A_5A_4+A_5'A_4')+LA_1+LLA_1+MA_3+OA_3$ $C_0=GA_0+HA_0+JA_4'+KA_4'+LA_0+LLA_0+MA_2+NA_3+OA_3'$ 5. The PRML code encoding method as claimed in claim 1, using "Table 1" for the encoding step.

6. A PRML code decoding method for decoding 9-bit codewords generated from 8-bit input data, on a high-density data storage device, comprising the steps of:

(a) reproducing a signal corresponding to a predetermined 9-bit codeword Y, where $Y_K$ is 1 or 0 and k is 1, 2, ... 9, generated from 8-bit input data X, which is a predetermined series of 8-bit binary data symbols with an integer time of k as an index, $X_K$ of 1 or 0, and k of 1, 2, ..., 8 in a storage device or a communications channel, so that the generated signal is easily detected;

(b) detecting the reproduced signal to minimize an error rate; and (c) decoding the detected signal according to channel characteristics and a decoder mapping between the 8-bit input data and the 9-bit codeword, and recovering the decoded signal to the 8-bit input data through error correction and compression decoding, wherein the decoder mapping is obtained from the substeps of:

(c1) generating a 9-bit sub-codeword with a maximum transition run (MTR) of 3;

(c2) generating a 9-bit sub-codeword with a maximum zero run length k of 7 from the 9-bit sub-codeword generated in substep (c1);

(c3) determining whether the fifth bit of the 9-bit sub-codeword satisfying substeps (c1) and (c2) is zero, going to substep (c4) if the determination result is zero, and jumping to substep (c5) if the determination result is not zero;

(c4) mapping the first four bits and last four bits of the 8-bit input data to the first four bits and last four bits of the 9-bit codeword respectively without variation;

(c5) if the determination result of substep (c3) was not zero, mapping the 8-bit input data to the most approximate 9-bit codeword which has a one in the fifth bit thereof; and (c6) making the decoder mapping between the 8-bit input data and the 9-bit codewords according to the mapping results of substeps (c4) and (c5) and simplifying the mapping principles to Karnaugh maps.

7. The PRML code decoding method as claimed in claim 6, further comprising the step of applying a decoding mapping expressed as:

$G=C_4'$ $H=C_6C_7'C_4C_3'$ $J=C_5'C_4C_3'(C_2'+C_1')(C_2'+C_0')$ $K=C_5'C_4C_3(C_6'+C_7')(C_2'+C_1')$ $L=C_8'C_6'C_5C_4(C_7'+C_8')(C_3+C_2)$ $LL=C_8'C_6'C_5C_4C_3C_2(C_7+(C_1 \oplus C_0)$ $M=C_8C_6'C_5C_4C_3C_2'$ $N=C_5'C_4C_3'C_2(C_7+C_6)(C_6+C_5)(C_6+C_5)$ $O=C_8'C_7'C_5'C_4C_3'C_2(C_8+C_0)(C_1+C_0)$ $A_7=GC_8+H+J+K(C_7+C_5C_6)+NC_1+O$ $A_6=GC_7+H+J+K(C_3+C_1C_0)+NC_0+O$ $A_5=GC_0+HC_0+J(C_1C_0+C_1'C_0')+K(C_1 \oplus C_0)+NC_0+O$ $A_4=GC_5+HC_5+JC_0'+KC_0'+NC_0+O$ $A_3=GC_3+J+KC_8+LL+MC_1+NC_7C_8+OC_1$ $A_2=GC_2+HC_2+JC_7+K(C_8+C_6)+L(C_7+C_2'C_1'C_0')+LL(C_7 \oplus (C_1C_0))+MC_0+NC_7+OC_6$ $A_1=GC_1+HC_1+JC_8+K(C_5+C_6)+LC_1+LLC_1+MC_0+NC_7+OC_8$ $A_0=GC_0+HC_0+JC_5+K(C_5+C_6)+LC_0+LLC_0+MC_0+NC_1+OC_5$.

8. The PRML code decoding method as claimed in claim 6, using the following table:

| | | | | | | | |
|---|---|---|---|---|---|---|---|
| FF→ 056 | FB→ 074 | 67→ 05D | CE→ 0D1 | 3A→ 06A | A1→ 141 | 0D→ 0B9 | 74→ 0E4 |
| DB→ 072 | D7→ 0DC | 43→ 083 | AA→ 14A | 16→ 026 | 7D→ 0ED | E4→ 154 | 50→ 01C |
| B7→ 0DA | B3→ 163 | 1F→ 163 | 86→ 106 | ED→ 0B3 | 59→ 0A9 | C0→ 09B | 2C→ 04C |
| 93→ 123 | 8F→ 0D6 | F6→ 176 | 62→ 0C2 | C9→ 031 | 35→ 065 | 9C→ 12C | 08→ 13A |
| 6F→ 11D | 6B→ 0CB | D2→ 132 | 3E→ 06E | A5→ 145 | 11→ 021 | 78→ 0EB | DF→ 15C |
| 4B→ 088 | 47→ 058 | AE→ 14W | 1A→ 02A | 81→ 101 | E8→ 013 | 54→ 0A4 | BB→ 16B |
| 27→ 059 | 23→ 043 | 8A→ 10A | F1→ 171 | 5D→ 0AD | C4→ 114 | 30→ 01A | 97→ 0DB |
| 03→ 03B | FA→ 054 | 66→ 0C6 | CD→ 081 | 39→ 069 | A0→ 099 | 0C→ 0B8 | 73→ 0E3 |
| FE→ 0D4 | D6→ 136 | 42→ 082 | A9→ 149 | 15→ 025 | 7C→ 0EC | E3→ 153 | 4F→ 11B |
| DA→ 052 | B2→ 162 | 1E→ 02E | 85→ 105 | EC→ 093 | 58→ 0AB | BF→ 15A | 2B→ 04B |
| B6→ 156 | 8E→ 10E | F5→ 175 | 61→ 0C1 | C8→ 011 | 34→ 064 | 9B→ 12B | 07→ 139 |
| 92→ 122 | 6A→ 0CA | D1→ 131 | 3D→ 06D | A4→ 144 | 10→ 018 | 77→ 095 | DE→ 0D2 |
| 6E→ 0CE | 46→ 086 | AD→ 14D | 19→ 029 | 80→ 076 | E7→ 0DD | 53→ 0A3 | BA→ 16A |
| 4A→ 08A | 22→ 042 | 89→ 109 | F0→ 015 | 5C→ 0AC | C3→ 113 | 2F→ 119 | 96→ 126 |
| 26→ 046 | F9→ 034 | 65→ 0C5 | CC→ 091 | 38→ 068 | 9F→ 158 | 0B→ 0BB | 72→ 0E2 |
| 02→ 036 | D5→ 135 | 41→ 081 | A8→ 148 | 14→ 024 | 7B→ 0EB | E2→ 152 | 4E→ 08E |
| FD→ 0B4 | B1→ 161 | 1D→ 02D | 84→ 104 | EB→ 073 | 57→ 05C | BE→ 16E | 2A→ 04A |
| D9→ 032 | 8D→ 10D | F4→ 174 | 60→ 01D | C7→ 0DB | 33→ 063 | 9A→ 12A | 06→ 086 |
| B5→ 165 | 69→ 0C9 | D0→ 09C | 3C→ 143 | A3→ 143 | 0F→ 13B | 76→ 0E6 | DD→ 082 |
| 91→ 121 | 45→ 085 | Ac→ 14C | 18→ 028 | 7F→ 0D6 | E6→ 156 | 52→ 0A2 | B9→ 169 |
| 6D→ 0CD | 21→ 041 | 88→ 108 | EF→ 15D | 5B→ 0AB | C2→ 112 | 2E→ 04E | 95→ 125 |
| 49→ 089 | F8→ 014 | 64→ 064 | CB→ 071 | 37→ 05A | 9E→ 12E | 0A→ 03A | 71→ 0E1 |
| 25→ 045 | D4→ 134 | 40→ 010 | A7→ 0D9 | 13→ 023 | 7A→ 0EA | E1→ 151 | 4D→ 08D |
| 01→ 035 | B0→ 09A | 1C→ 02C | 83→ 103 | EA→ 053 | 56→ 0A6 | BD→ 16D | 29→ 049 |
| FC→ 094 | 8C→ 10C | F3→ 173 | 5F→ 11C | C6→ 116 | 32→ 062 | 99→ 129 | 05→ 0B5 |
| D8→ 012 | 68→ 0C8 | CF→ 158 | 3B→ 06B | A2→ 142 | 0E→ 0BA | 75→ 0E5 | DC→ 092 |
| B4→ 164 | 44→ 084 | AB→ 14B | 17→ 058 | 7E→ 0EE | E5→ 155 | 51→ 0A1 | B8→ 168 |
| 90→ 098 | 20→ 019 | 87→ 095 | EE→ 0D3 | 5A→ 0AA | C1→ 111 | 2D→ 040 | 94→ 124 |
| 6C→ 0CC | F7→ 055 | 63→ 0C3 | CA→ 051 | 36→ 066 | 9D→ 12D | 09→ 039 | 70→ 075 |
| 48→ 088 | D3→ 133 | 3F→ 11A | A6→ 146 | 12→ 022 | 79→ 0E9 | E0→ 09D | 4C→ 08C |
| 24→ 044 | AF→ 159 | 1B→ 02B | 82→ 102 | E9→ 033 | 55→ 0A5 | BC→ 16C | 28→ 048 |
| 00→ 138 | 8B→ 10B | F2→ 172 | 5E→ 0AE | C5→ 115 | 31→ 061 | 98→ 128 | 04→ 038 | for the decoding step.

\* \* \* \* \*